(12) United States Patent
Vecchi et al.

(10) Patent No.: US 11,437,569 B2
(45) Date of Patent: Sep. 6, 2022

(54) HALL SENSOR STRUCTURE

(71) Applicant: TDK-Micronas GmbH, Freiburg (DE)

(72) Inventors: Maria-Cristina Vecchi, Freiburg (DE);
Reinhard Erwe, Freiburg (DE);
Martin Cornils, Freiburg (DE);
Kerwin Khu, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 137 days.

(21) Appl. No.: 16/877,120

(22) Filed: May 18, 2020

(65) Prior Publication Data

US 2020/0365796 A1    Nov. 19, 2020

(30) Foreign Application Priority Data

May 16, 2019 (DE) .................. 10 2019 003 481.3

(51) Int. Cl.
*G01R 33/07* (2006.01)
*H01L 43/06* (2006.01)
*H01L 43/04* (2006.01)

(52) U.S. Cl.
CPC .......... *H01L 43/065* (2013.01); *G01R 33/07* (2013.01); *H01L 43/04* (2013.01)

(58) Field of Classification Search
CPC ........ H01L 43/065; H01L 27/22; G01R 33/07
See application file for complete search history.

(56) References Cited

U.S. PATENT DOCUMENTS

| | | | |
|---|---|---|---|
| 5,679,973 A | 10/1997 | Mochizuki et al. | |
| 9,097,753 B2 | 8/2015 | Raz et al. | |
| 10,234,486 B2 * | 3/2019 | Shibib | H01L 21/28035 |
| 2004/0232494 A1 * | 11/2004 | Nagano | H01L 21/823864 |
| | | | 257/E21.654 |
| 2007/0051971 A1 * | 3/2007 | Ferreira | H01L 21/76801 |
| | | | 257/E21.507 |

(Continued)

FOREIGN PATENT DOCUMENTS

| | | |
|---|---|---|
| DE | 10 2011 107 767 A1 | 1/2013 |
| JP | 2006-108448 A | 4/2006 |
| JP | 2006-179594 A | 7/2006 |

OTHER PUBLICATIONS

Sander et al., "From Three-Contact Vertical Hall Elements to Symmetrized Vertical Hall Sensors with Low Offset," Sensors and Actuators A: Physical, vol. 240, pp. 92-102 (2016).

*Primary Examiner* — Dominic E Hawkins
(74) *Attorney, Agent, or Firm* — Muncy, Geissler, Olds & Lowe, P.C.

(57) ABSTRACT

A Hall sensor structure comprising a semiconductor body of a first conductivity type, a well region of a second conductivity type extending from a top side of the semiconductor body into the semiconductor body, at least three first semiconductor contact regions of the second conductivity type, each extending from a top side of the well region into the well region, at least one second semiconductor contact region of a second conductivity type, wherein the first semiconductor contact regions are spaced apart from one another and from an edge of the well region, a metallic connection contact layer is arranged on each first semiconductor contact region, the at least one second semiconductor contact region extends along the top side of the semiconductor body at least partially around the well region.

18 Claims, 2 Drawing Sheets

(56) References Cited

U.S. PATENT DOCUMENTS

| | | | |
|---|---|---|---|
| 2007/0290682 A1* | 12/2007 | Oohira | G01R 33/075 257/E43.003 |
| 2012/0196155 A1* | 8/2012 | Bencher | G11B 5/743 427/127 |
| 2014/0175528 A1* | 6/2014 | Zieren | G01R 33/066 257/295 |

* cited by examiner

HALL SENSOR STRUCTURE

This nonprovisional application claims priority under 35 U.S.C. § 119(a) to German Patent Application No. 10 2019 003 481.3, which was filed in Germany on May 16, 2019, and which is herein incorporated by reference.

BACKGROUND OF THE INVENTION

Field of the Invention

The present invention relates to a Hall sensor structure.

Description of the Background Art

A Hall sensor structure comprising a plurality of Hall sensor elements, connected in series, is known from DE 10 2011 107 767 A1, which corresponds to U.S. Pat. No. 9,097,753, which is incorporated herein by reference. Each Hall sensor element comprises three n-type semiconductor contact regions in an n-well region, wherein an isolation region is disposed between each of the n-type semiconductor contact regions, e.g., from a heavily doped p+ diffusion.

A vertical Hall sensor structure with six n+ semiconductor contact regions and an isolating well-shaped p-region in an n-well region is known from US 2007/0290682 A1.

Further Hall sensor structures are known from JP 2006-179 594 A, JP 2006-108 448 A, and U.S. Pat. No. 5,679,973 A.

A Hall sensor structure with five n+ semiconductor contacts within an n-well formed in a p-substrate is known from Sander, Christian et al., "From Three-Contact Vertical Hall Elements to Symmetrized Vertical Hall Sensors with Low Offset", Sensors and Actuators A, Physical, Vol. 240, 2016, pp. 92-102, where the n-well is completely surrounded by a p-doped guard ring and the guard ring overlaps with both the n-well and the substrate.

SUMMARY OF THE INVENTION

It is therefor an object of the invention to provide a device that refines the state of the art.

According to an exemplary embodiment of the invention, a Hall sensor structure is provided, comprising a semiconductor body of a first conductivity type and a well region of a second conductivity type extending from a top side of the semiconductor body into the semiconductor body.

At least three first semiconductor contact regions of the second conductivity type, each extending from a top side of the well region into the well region, are formed in the well region.

Furthermore, at least one second semiconductor contact region of the first conductivity type, extending from the top side of the well region into the well region, is formed.

The first semiconductor contact regions are each spaced apart from one another and preferably from an edge of the well region.

A metallic connection contact layer is arranged on each first semiconductor contact region. At least one second semiconductor contact region extends along the top side of the semiconductor body at least partially around the well region.

The well region and the second semiconductor contact region overlap in an overlap region that extends from the top side of the semiconductor body into the semiconductor body.

The top side of the well region and the top side of the semiconductor contact regions can coincide with the top side of the semiconductor body and preferably form a flat plane.

The overlap region contains dopants of the first conductivity type with a concentration corresponding to the well region and dopants of the second conductivity type with a concentration corresponding to the second semiconductor contact region.

Furthermore, the well region embedded in the substrate can be limited in the lateral dimensions by means of an active area mask.

An advantage is that the overlap of the second semiconductor contact region with the well region, in particular even at low currents, provides minority charge carriers when the sensor is switched on, as a result which the transient properties improve and in particular a drift of the measured values immediately after switching on is suppressed.

In other words, a stability of the measured values can be ensured by the formation of the overlap region and a high sensitivity can be achieved immediately after switching on.

A further advantage is that a threshold voltage implantation in the area of the n-well can be avoided and the switch-on behavior can be improved even at a low n-well doping in the range of less than $8 \cdot 10^{15}$ N/cm$^3$, as a result of which a high sensitivity of the Hall sensor structure is achieved. A highly sensitive Hall sensor with improved switch-on behavior is therefore provided.

The overlap region along the top side of the semiconductor body has a width of at least 0.1 μm or a width of 1-2 μm. Even a relatively small overlap or a relatively small width of the overlap region is sufficient to ensure a stable, time-independent operation of the Hall sensor structure immediately after switching on.

The Hall sensor structure can have exactly one second semiconductor contact region, the second semiconductor contact region having a closed shape extending around the well region.

Also, all second semiconductor contact regions, contained in the Hall sensor structure, together can extend along at least 50% or at least 75% or at least 95% of a perimeter of the well region.

The well region can have a rectangular top side, wherein the at least one second semiconductor contact region extends along a first edge and/or along a second edge and/or along a third edge and/or along a fourth edge of the rectangular top side. Edge in this case designates the outer edge of the well region on the surface of the substrate.

The Hall sensor structure can have a dielectric isolation layer, wherein the isolation layer covers the top side of the semiconductor body and the top side of the well region, comprises an oxide, and the oxide has a thickness of at least 1 nm or in a range between 3 nm and 30 nm. The isolation layer comprises the gate oxide.

In a refinement, the Hall sensor structure has a polysilicon layer, wherein the polysilicon layer covers part of a top side of the first isolation layer and the polysilicon layer has a thickness of 0.1-0.8 μm or 0.4-0.6 μm.

The polysilicon layer forms the gate poly and is silicided in a refinement in order to be able to establish a reliable active electrical connection. The polysilicon layer is preferably clamped to a reference potential. Preferably, the reference potential is formed as a ground potential.

The polysilicon layer can have a distance of at least 0.1 μm or at least 0.4 μm from each first semiconductor contact region. The distance preferably comprises a spacer oxide or the distance is due to the formation of the spacer oxide.

The first conductivity type is n-type and the second conductivity type is p-type or that the first conductivity type is p-type and the second conductivity type is n-type.

The first semiconductor contact regions each can have a dopant concentration of at least $5 \cdot 10^{18}$ N/cm$^3$. In one embodiment, the well region has a dopant concentration in a range between $1 \cdot 10^{14}$-$5 \cdot 10^{16}$ N/cm$^3$. The well region preferably has a dopant concentration in a range between $5 \cdot 10^{14}$-$5 \cdot 10^{15}$ N/cm$^3$.

The well region areas, formed between the first semiconductor contact regions, or the entire well region can be free of threshold voltage implantation.

Threshold voltage implantation-free means that no implantation is made for setting a threshold voltage of MOS transistors, in particular no implantation of boron.

The well region and/or the first semiconductor contact regions and/or the second semiconductor contact region can be produced by means of implantation and diffusion. The well region is preferably formed as an n-well, wherein the doping of the well is carried out by means of phosphorus.

The second semiconductor contact region can be electrically connected by means of a channel region formed outside the well region. The channel region preferably extends beyond the active area of the well region lying therein and has at least one metallic connection contact layer.

The first semiconductor contact regions can each be spaced apart from an edge of the well region.

The second semiconductor contact regions can be connected to a reference potential, preferably the ground potential. Furthermore, the two first semiconductor contacts lying in the well region are preferably connected to a control and evaluation unit.

The second semiconductor contact regions each can have a dopant concentration of at least $5 \cdot 10^{18}$ N/cm$^3$. Preferably, the second semiconductor contact regions extend from the surface of the semiconductor body less than 0.5 μm deep into the semiconductor body.

In one embodiment, the second semiconductor contact regions are at least partially or completely covered by an isolation layer formed as a gate oxide. A polysilicon layer is preferably arranged on the isolation layer.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
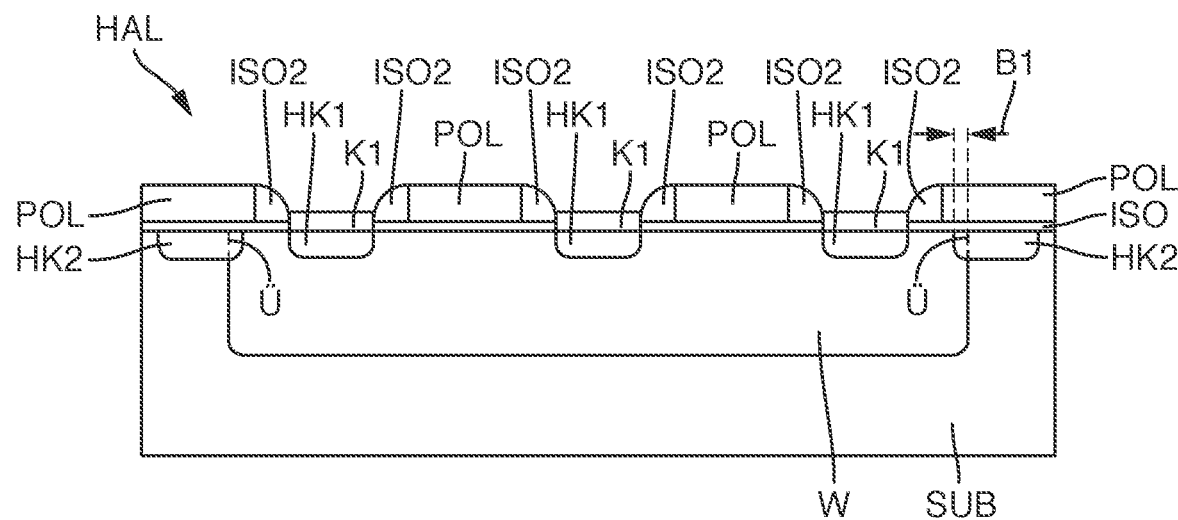
FIG. 1 shows a cross section of an embodiment of a Hall sensor structure.

The illustration of FIG. 1 shows a cross section of an embodiment of the invention of a Hall sensor structure HAL. A, for example, p-doped substrate SUB has a, for example, n-doped well region W extending from a top side of substrate SUB into substrate SUB. Three, for example, n-doped first semiconductor contact regions HK1 extend from a top side of well region W into well region W, wherein first semiconductor contact regions HK1 are spaced apart from one another and from an edge of well region W.

A metallic connection contact layer K1 is in each case formed flat on a top side of each first semiconductor contact region HK1 in order to form active electrical connections.

The remaining top side of substrate SUB is covered by an isolation layer ISO, e.g., by a gate oxide. A polysilicon layer POL, e.g., silicided polysilicon, is formed on a top side of isolation layer ISO at a distance from the metallic connection contact layers K1. The distances between polysilicon layer POL and connection contact layers K1 each comprise a spacer oxide ISO2.

In addition, a, for example, p-doped second semiconductor contact region HK2 is formed in substrate SUB, wherein second semiconductor contact region HK2 extends from the top side of substrate SUB into substrate SUB and along the top side around well region W. Second semiconductor contact region HK2 is arranged next to well region W such that it overlaps well region W. The overlap region U formed by the overlap has a width B1.

Figure 2:
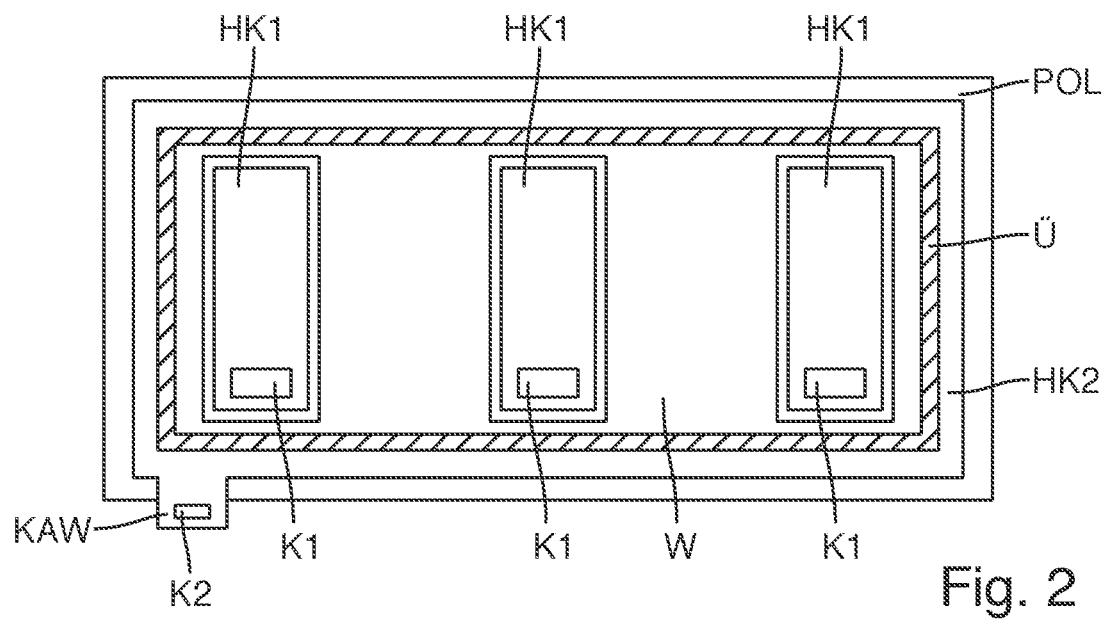
FIG. 2 shows a plan view of an embodiment of the Hall sensor structure.

A plan view of a further embodiment is shown in the illustration of FIG. 2. Only the differences from the illustration in FIG. 1 will be explained below.

Metallic contact layers K1 are formed in areas on first semiconductor contact regions HK1. In particular, if the polysilicon layer is sufficiently silicided, it is not absolutely necessary to form metal contact layers K1 over the entire surface.

Well region W has a rectangular top side, wherein second semiconductor contact region HK2 completely surrounds the top side of well region W, therefore, extends along all four sides of the top side of well region W.

In addition, second semiconductor contact region HK2 has a channel region KAW. Channel region KAW extends outward from second semiconductor contact region HK2 to form a connection contact layer K2.

Figure 3:
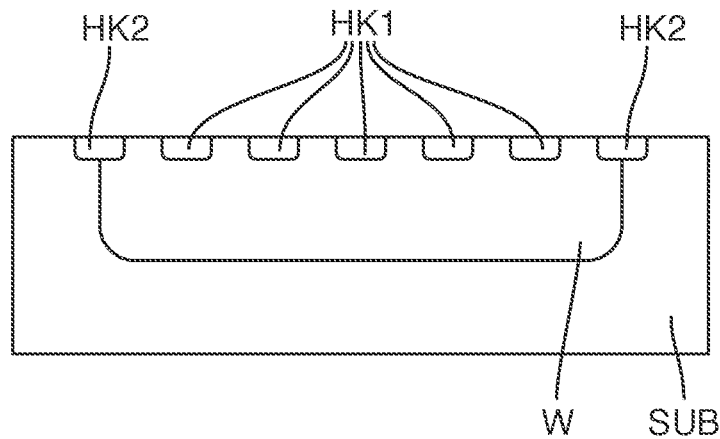
FIG. 3 shows a cross section of an embodiment of the Hall sensor structure.

A cross section of a further embodiment is shown in the illustration in FIG. 3. Only the differences from the illustration in FIG. 1 will be explained below.

Only substrate SUB is shown without the gate oxide and polysilicon layer and without metal contact layers.

Five first semiconductor contact regions HK1, each spaced apart from one another, are arranged in well region W in the substrate.

Figure 4:
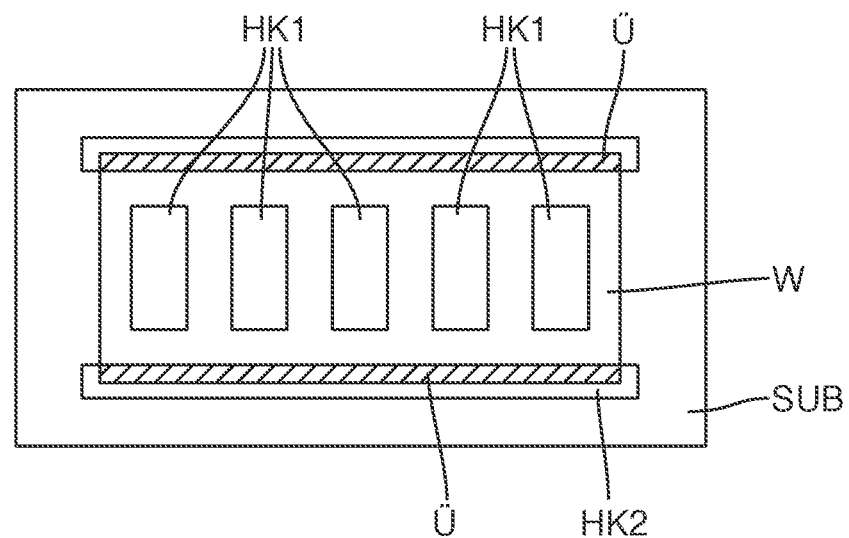
FIG. 4 shows a plan view of an embodiment of the Hall sensor structure.

A plan view of a further embodiment is shown in the illustration of FIG. 4. Only the differences from the illustration in FIG. 2 will be explained below.

In the illustrated embodiment, Hall sensor structure HAL comprises five first semiconductor contact regions HK1 and two second semiconductor contact regions HK2, wherein second semiconductor contact regions HK2 extend along two mutually opposite sides of the rectangular top side of well region W.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A Hall sensor structure comprising:
a semiconductor body of a first conductivity type;
a well region of a second conductivity type extending from a top side of the semiconductor body into the semiconductor body;
at least three first semiconductor contact regions of the second conductivity type, each extending from a top side of the well region into the well region, the first semiconductor contact regions each being spaced apart from one another;
at least one second semiconductor contact region of the first conductivity type, extending from the top side of the well region into the well region; and
a metallic connection contact layer arranged on each first semiconductor contact region,
wherein the at least one second semiconductor contact region extends along a top side of the semiconductor body at least partially around the well region,
wherein the well region and the second semiconductor contact region overlap in an overlap region that extends from the top side of the semiconductor body into the semiconductor body, the overlap region being formed along and overlapping an edge of the well region, and
wherein the second semiconductor contact region extends along at least one edge and at most along three edges of the well region.

2. The Hall sensor structure according to claim 1, wherein the overlap region along the top side of the semiconductor body has a width of at least 0.1 μm or a width of 1-2 μm.

3. The Hall sensor structure according to claim 1, wherein all second semiconductor contact regions contained in the Hall sensor structure extend along at least 50% or at least 75% or at least 95% of a perimeter of the well region.

4. The Hall sensor structure according to claim 1, wherein the well region has a rectangular top side.

5. The Hall sensor structure according to claim 1, wherein the Hall sensor structure has a dielectric isolation layer,
wherein the isolation layer comprises an oxide and covers a top side of the semiconductor body and a top side of the well region, and
wherein the oxide has a thickness of at least 1 nm or a thickness in a range between 3 nm and 30 nm.

6. The Hall sensor structure according to claim 5, wherein the Hall sensor structure has a polysilicon layer,
wherein the polysilicon layer covers part of a top side of the isolation layer, and
wherein the polysilicon layer has a thickness of 0.1-0.8 μm or 0.4-0.6 μm.

7. The Hall sensor structure according to claim 6, wherein the polysilicon layer has a distance of at least 0.2 μm or at least 0.4 μm from each first semiconductor contact region.

8. The Hall sensor structure according to claim 1, wherein the first conductivity type is n-type and the second conductivity type is p-type or wherein the first conductivity type is p-type and the second conductivity type is n-type.

9. The Hall sensor structure according to claim 1, wherein the first semiconductor contact regions each have a dopant concentration of $5 \cdot 10^{18}$ N/cm$^3$.

10. The Hall sensor structure according to claim 1, wherein the well region has a dopant concentration of $5 \cdot 10^{14}$-$5 \cdot 10^{16}$ N/cm$^3$.

11. The Hall sensor structure according to claim 1, wherein at least the areas of the well region, areas extending between the first semiconductor contact regions, or the entire well region is free of threshold voltage implantation.

12. The Hall sensor structure according to claim 1, wherein the second semiconductor contact region is electrically connected via a channel region formed outside the well region.

13. The Hall sensor structure according to claim 1, wherein the first semiconductor contact regions are each spaced apart from an edge of the well region.

14. The Hall sensor structure according to claim 1, wherein the second semiconductor contact regions each have a dopant concentration of $5 \cdot 10^{18}$ N/cm$^3$.

15. The Hall sensor structure according to claim 1, wherein the second semiconductor contact regions extend from a surface of the semiconductor body less than 0.5 μm deep into the semiconductor body.

16. The Hall sensor structure according to claim 1, wherein the second semiconductor contact regions are at least partially or completely covered by an isolation layer, formed as a gate oxide, and
wherein a polysilicon layer is arranged on the isolation layer.

17. The Hall sensor according to claim 1, further comprising a spacer oxide formed on ends of the polysilicon layer to space the polysilicon layer from the metallic connection layer.

18. The Hall sensor according to claim 1, wherein the metallic connection layer extends along an entire surface of each of the at least three first semiconductor contact regions.

* * * * *